United States Patent [19]
Stave

[11] Patent Number: 5,734,198
[45] Date of Patent: Mar. 31, 1998

[54] MULTI-LAYER LEAD FRAME FOR A SEMICONDUCTOR DEVICE

[75] Inventor: Eric J. Stave, Boise, Id.

[73] Assignee: Micron Technology, Inc., Boise, Id.

[21] Appl. No.: 811,343

[22] Filed: Mar. 4, 1997

Related U.S. Application Data

[63] Continuation of Ser. No. 711,668, Sep. 4, 1996, abandoned, which is a continuation of Ser. No. 336,997, Nov. 10, 1994, abandoned.

[51] Int. Cl.⁶ .................................................. H01L 23/495
[52] U.S. Cl. ................................................ 257/666; 257/676
[58] Field of Search ................................ 257/666, 676, 257/924, 668, 787

[56] References Cited

U.S. PATENT DOCUMENTS

| | | | |
|---|---|---|---|
| 4,410,905 | 10/1983 | Grabbe | 357/80 |
| 4,680,613 | 7/1987 | Daniels et al. | 357/72 |
| 4,891,687 | 1/1990 | Mallik et al. | 357/70 |
| 4,965,654 | 10/1990 | Karner et al. | 357/70 |
| 4,984,059 | 1/1991 | Kubota et al. | 357/68 |
| 4,994,936 | 2/1991 | Hernandez | 361/306 |
| 5,032,895 | 7/1991 | Horiuchi et al. | 357/72 |
| 5,095,402 | 3/1992 | Hernandez et al. | 361/306 |
| 5,103,283 | 4/1992 | Hite | 357/51 |
| 5,105,257 | 4/1992 | Michii | 357/70 |
| 5,140,496 | 8/1992 | Heinks et al. | 361/306 |
| 5,200,364 | 4/1993 | Loh | 437/209 |
| 5,212,402 | 5/1993 | Higgins, III . | |
| 5,235,209 | 8/1993 | Shimizu et al. | 257/692 |
| 5,237,202 | 8/1993 | Shimizu et al. | 257/672 |
| 5,281,556 | 1/1994 | Shimizu et al. | 437/206 |
| 5,291,060 | 3/1994 | Shimizu et al. | 257/667 |
| 5,311,056 | 5/1994 | Wakabayashi et al. | 257/666 |
| 5,365,106 | 11/1994 | Watanabe | 257/676 |

FOREIGN PATENT DOCUMENTS

| | | |
|---|---|---|
| 3626151 | 2/1988 | Germany . |
| 63-93139 | 4/1988 | Japan . |
| 3165549 | 7/1991 | Japan . |
| 3276747 | 12/1991 | Japan . |
| 4162657 | 6/1992 | Japan . |
| 4188759 | 7/1992 | Japan . |
| 6045504 | 2/1994 | Japan . |

*Primary Examiner*—Tom Thomas
*Assistant Examiner*—Roy Potter
*Attorney, Agent, or Firm*—Trask, Britt & Rossa

[57] ABSTRACT

A multi-layer lead frame for decoupling a power supply to a semiconductor die includes overlaying first and second lead frame bodies having an insulator disposed therebetween and at least one main lead finger extending from each body. The bodies act as a capacitor to decouple the power supply to the die. One of the bodies and respective finger provides one of power supply and ground connections for wire bonding with the die, and the other of the bodies provides the other of power supply and ground connections for wire bonding with the die. The first body includes a die paddle for supporting the die, and the second body includes a plate for overlaying the paddle with the insulator disposed between the paddle and plate, thereby providing an electrical decoupling effect therebetween upon supplying power and ground connections, respectively.

19 Claims, 3 Drawing Sheets

MULTI-LAYER LEAD FRAME FOR A SEMICONDUCTOR DEVICE

This is a continuation of application Ser. No. 08/711,668, filed Sep. 4, 1996 now abandoned; which is a FWC of application Ser. No. 08/336,997, filed Nov. 10, 1994, now abandoned.

TECHNICAL FIELD

This invention relates in general to a semi-conductor lead package system and, more particularly, to a multi-layer lead frame for decoupling the power supply to an integrated circuit chip.

BACKGROUND OF THE INVENTION

A semiconductor integrated circuit (IC) packaged device (part) generally includes an IC chip (die) being connected to inner leads of a lead frame by wire bonds. The chip, wire bonds, and inner leads are completely encapsulated for protection with a substance, such as plastic. Outer leads communicate with the inner leads of the lead frame, but the outer leads typically remain exposed for mounting of the packaged device to external circuitry, such as a printed circuit board.

In a conventional IC packaged device, a semiconductor die is placed on and bonded to a center die paddle of a lead frame for support. Inner lead fingers of the lead frame are disposed proximate to the paddle but do not contact or communicate with the paddle. Rather, wire bonds communicate between contact pads (terminals) on the die and the inner lead fingers of the lead frame by spanning the gap between the die and the fingers. The wire bonds allow for the transmission of the electrical signals between the die and the lead frame.

The recent production of three (3) volt IC chips has created the need for better power supply stability when testing and using the parts. Small spikes, glitches, bounces, noise, or the like (collectively "distortions") on the power supply is more likely to cause failure in these 3-volt parts than in five (5) volt parts which have a better margin of error for power supply distortions. Namely, a given distortion at 3 volts is a higher percentage of the over all voltage than that at 5 volts.

In effort to resolve potential failure from voltage distortions, decoupling capacitors have been mounted externally to the part on a board, or mounted on a handler during testing, in order to ensure a cleaner voltage supply to the part. However, for best decoupling, a capacitor must be mounted as close to the part as possible. But in effort to mount a capacitor close to a part, other drawbacks usually arise. For example, a capacitor can be embodied on a die, but this takes up valuable and limited die space. Also, when testing a part in a handler, it is difficult to mount a capacitor close enough to the part to provide a reasonable amount of decoupling.

Thus, in attempt to provide power supply decoupling, and also to improve heat dissipation and electrical performance, it has been known to use a multi-layer lead frame wherein one of power supply and ground connections is supplied through a first layer, and the other of power supply and ground connections is supplied through a second layer. For example, U.S. Pat. No. 4,891,687 issued to Mallik et al. on Jan. 2, 1990, discloses a multi-layer IC package. However, this disclosure requires the use of two conductive plates overlaying each other for power and ground, respectively, and a separate lead frame overlaying the plates for wire bonding. As such, the solution is undesirably complex. Namely, two separate layers of adhesive must bond the two plates and lead frame, one plate must have a center portion punched out for placement of the die and for wire bonding the die with the plates, and special tabs must be placed in precise locations on the plates for electrically connecting the plates with lead fingers of the lead frame.

Similarly, U.S. Pat. No. 4,965,654, issued to Karner et al. on Oct. 23, 1990, discloses a semiconductor package with a ground plane. However, in this case, the adaptation is only for a Lead Over Chip (LOC) implementation, and there are not two separate plates for power supply and ground connections, but rather only a ground plane and a lead frame overlaying the ground plane. Consequently, the decoupling capacitive effect is not as complete. Furthermore, the ground plane is actually two separate plates overlaying the die and proximate the bonding pads. This is necessary in order to allow for wire bonding of the lead fingers with the centrally located pads on the die. Moreover, the ground plane has special, small, cut away portions on a surface for wire bonding with the die.

Given the foregoing problems associated with existing art and techniques, objects of the present invention are to provide a semiconductor lead package system that provides good decoupling of a power supply to a semiconductor die with a simplified multi-layer lead frame.

SUMMARY OF THE INVENTION

According to principles of the present invention in its preferred embodiment, a multi-layer lead frame for decoupling a power supply to a semiconductor die includes overlaying first and second lead frame bodies having an insulator disposed therebetween and at least one main lead finger extending from each body. The bodies act as a capacitor to decouple the power supply to the die. One of the bodies and respective finger provides one of power supply and ground connections for wire bonding with the die, and the other of the bodies provides the other of power supply and ground connections for wire bonding with the die.

According to further principles of the present invention, the first body includes a die paddle for supporting the die, and the second body includes a plate. The paddle overlays the plate with the insulator disposed in between the paddle and plate, thereby providing an electrical decoupling effect therebetween upon supplying power and ground connections respectively.

According to further principles of the present invention, a method of decoupling a power supply is disclosed for a semiconductor die using a multi-layer lead frame as disclosed herein. The method comprises the steps of (1) supplying one of a power signal and a ground connection to the die through the first main lead finger extending from one of the paddle and plate, and wherein a wire bond communicates between the first main lead finger and one of a power and ground terminals of the die, and (2) supplying the other of the power signal and ground connection to the die through the second main lead finger extending from the other of the paddle and plate, and wherein a wire bond communicates between the second main lead finger and the other of the power and ground terminals of the die.

The aforementioned principles of the present invention provide an improved multi-layer lead frame for decoupling power supply to a semiconductor die. Other objects, advantages, and capabilities of the present invention will become more apparent as the description proceeds.

DETAILED DESCRIPTION OF THE INVENTION

Figure 1:
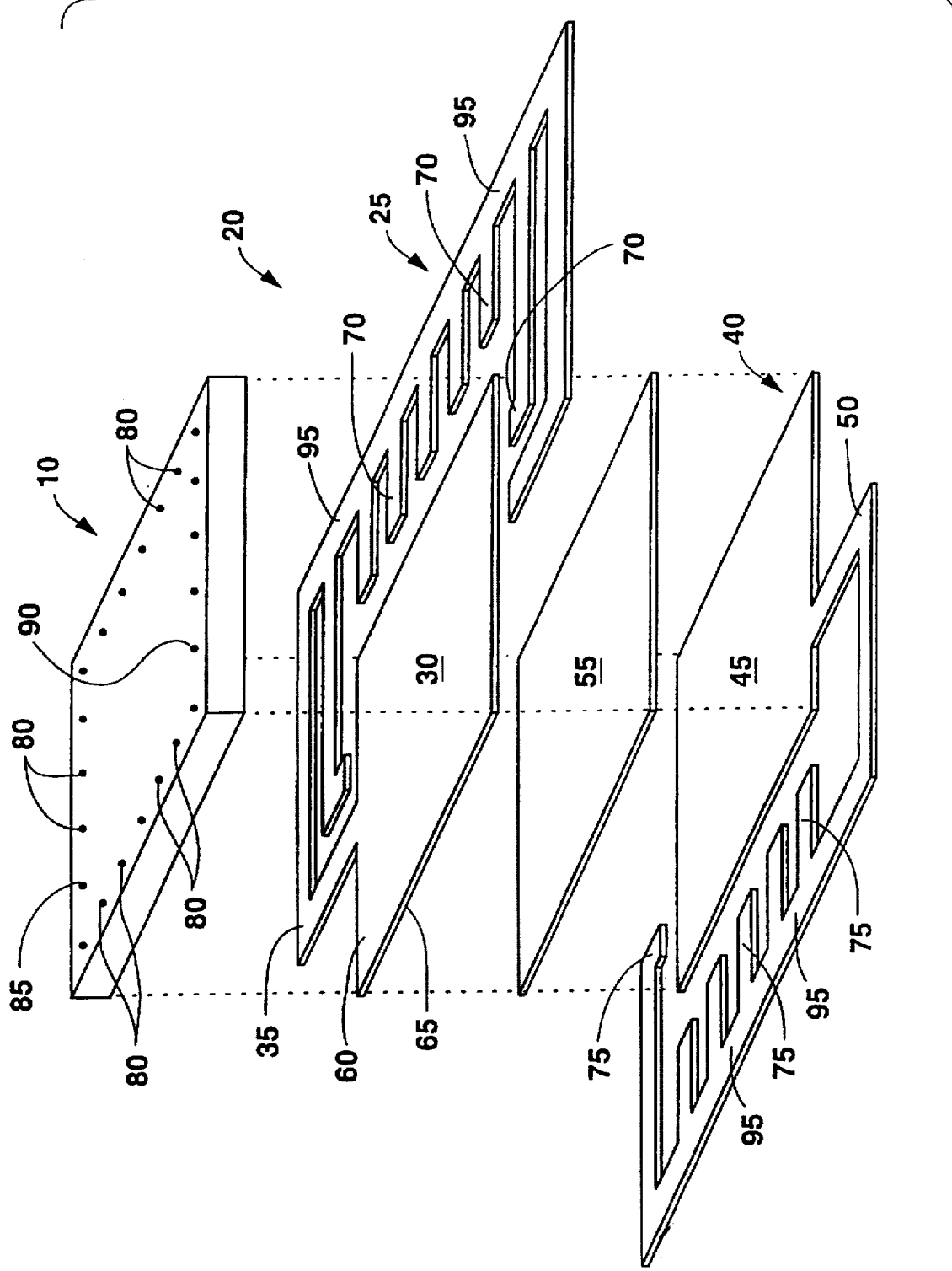
FIG. 1 is a perspective view of an exploded representation of of the embodiment of the present invention showing the spacial relationship between an IC chip and the present invention multi-layer lead frame.

FIG. 1 is a perspective view of an exploded representation of one embodiment of the present invention showing the spacial relationship between an IC chip (die) 10 and the present invention multi-layer lead frame 20. Lead frame 20 comprises first conducting lead frame body 25 having a die paddle 30 for supporting the die, and at least one first main lead finger 35 communicating with the paddle. Lead frame 20 further comprises a second conducting lead frame body 40 having a plate 45 and at least one second main lead finger 50 communicating with the plate. In the preferred embodiment, each main lead finger 35 and 50 is formed as a part of the paddle and plate, respectively, extending therefrom. Paddle 30 overlays plate 45 (or it could be said plate 45 overlays paddle 30), and insulator 55 is disposed therebetween.

One of paddle 30 and plate 45, and respective main lead finger 35 and 50, provides one of power supply and ground connections for wire bonding with one of power and ground terminals 85 and 90 of die 10. The other of the paddle and plate, and respective communicating main lead finger, provides the other of power supply and ground connections for wire bonding with the respective power and ground terminals 85 and 90 of the die.

Die 10 is supportable on a first planar surface 60 of paddle 30, and a second planar surface 65 (not visible) of the paddle opposite the first planar surface, overlays plate 45 with insulator 55 disposed therebetween.

In its preferred embodiment, paddle 30 is of a shape and dimension substantially similar to die 10. Namely, a circumferential dimension of paddle 30 is of a dimension substantially similar to a circumferential dimension of die 10. Likewise, plate 45 and insulator 55 are of a shape and dimension substantially similar to paddle 30.

Also in its preferred embodiment, insulator 55 is a double-sided thermosetting or thermoplastic adhesive coated polyimide film (tape), such as that sold under the trade name Dupont Kapton, or a sprayed on polyimide or other high dielectric material. Insulator 55 adheres paddle 30 to plate 45 and protects them from electrically shorting with each other.

First body 25 further includes, optionally, one or more signal lead fingers 70, each having a tip disposed proximate to and separate from paddle 30 for wire bonding signal leads with bonding pads (terminals) 80 of die 10. Likewise, second body 40 further includes, optionally, one or more signal lead fingers 75, each also having a tip disposed proximate to and separate from plate 45 for wire bonding signal leads with terminals 80 of die 10. Signal lead fingers 70 and 75 are termed "optional" because either first body 25, or second body 40 may have signal lead fingers in a mutually exclusive manner, or both may have signal lead fingers concurrently in any manner deemed best suited for a particular die used in conjunction with the lead frame. See FIG. 2 for further alternate embodiment details.

It should be noted here that lead finger bar supports 95 are not pertinent to the invention other than for supporting the lead fingers as part of the lead frame prior to being clipped off upon encapsulation of the die as is well known in the art.

Also, although not shown in the drawing, it is understood by those of ordinary skill in the art that an insulator may be disposed between paddle 30 and die 10 as appropriate, depending on the type of die being used.

In reference to an example for this embodiment of the invention, assume first main lead finger 35 of paddle 30 is designated to receive a power supply, and terminal 85 of die 10 is designated as a power supply terminal. Assume also that second main lead finger 50 of plate 45 is designated as a ground connection finger, and terminal 90 is a ground connection terminal for die 10. In this example, first main lead finger 35 would be wire bonded to power terminal 85 of die 10, and second main lead finger 50 would be wire bonded to ground terminal 90 of die 10. Any other signal connections are properly wire bonded between terminals 80 of die 10 and lead fingers 70 and 75 of either lead frame body respectively. This configuration allows the paddle and plate to act as a capacitor to decouple the power supply to the die, ensuring a more clean and stable voltage signal supply to the die.

This example configuration also demonstrates the simplicity of the present invention in providing a clean power supply to a die. Namely, (1) a separate lead frame does not overlay the paddle and plate for wire bonding as in the prior art; (2) no special punched out portions need be created in the paddle or plate for placement of the die as in the prior art; (3) no special tabs need be placed in precise locations on the paddle and plate for electrically connecting such with lead fingers of the lead frame as in the prior art; and (4) no special notched portions need be placed on the paddle and plate for wire bonding with the lead fingers as in the prior art.

Figure 2:
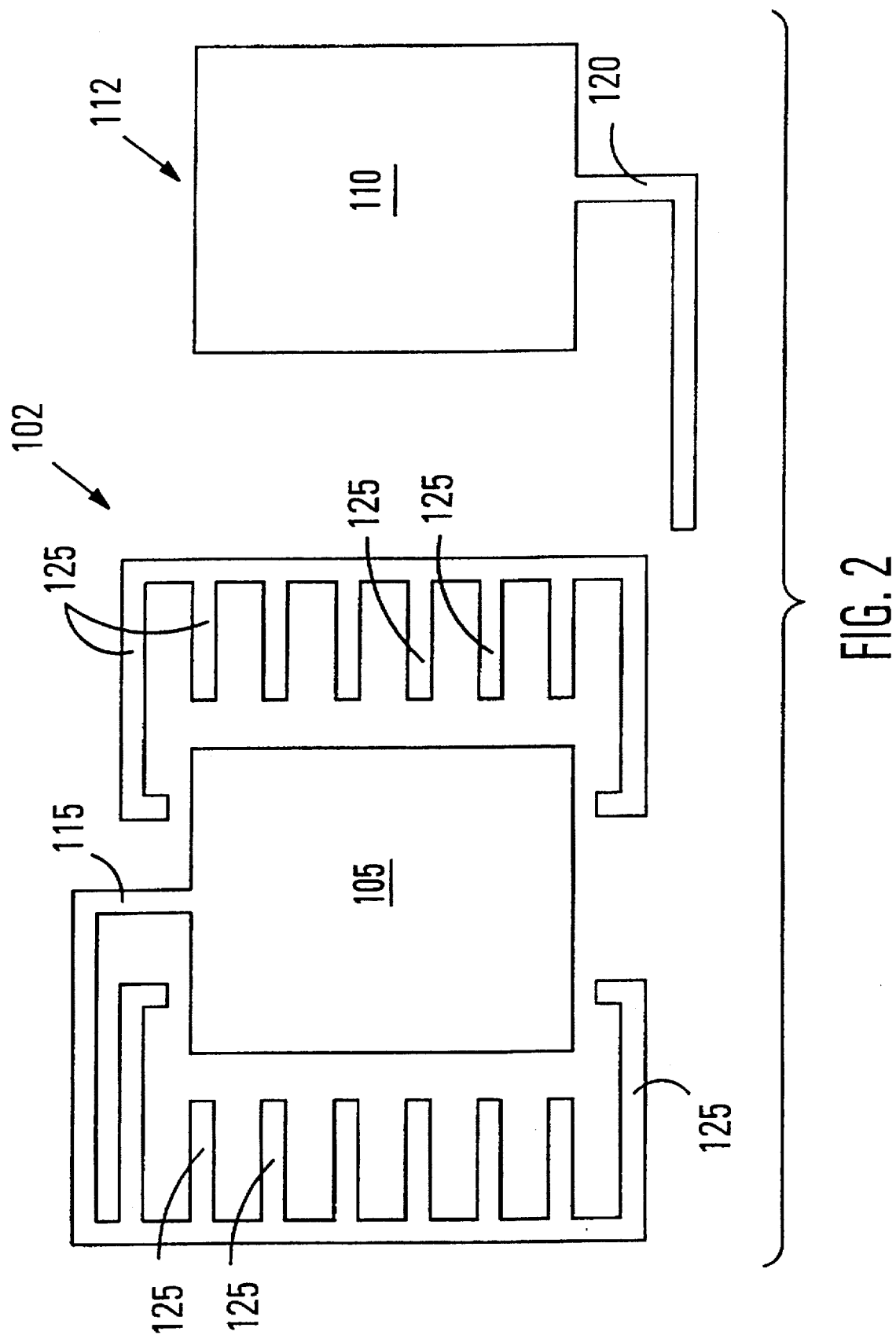
FIG. 2 is a plan view of an alternate embodiment of the present invention multi-layer lead frame.

Referring now to FIG. 2, a plan view of an alternate embodiment of the present invention multi-layer lead frame is depicted. Although shown separately in this drawing, first lead frame body 102 includes paddle 105 which overlays plate 110 of second lead frame body 112 according to principles of the present invention, and an insulator is disposed therebetween (not shown). First main lead finger 115 extends from paddle 105 for supplying one of power and ground connections, and second main lead finger 120 extends from plate 110 for supplying the other of power and ground connections. In this embodiment, all of the signal lead fingers 125 are disposed proximate to paddle 105 as part of first lead frame body 102, rather than some being disposed proximate to plate 110 as part of second body 112.

Although FIGS. 1 and 2 depict two examples of how the paddle and plate are shaped, and how and where the main lead fingers could extend from the paddle and plate, and how and where the signal lead fingers could be disposed proximate to the paddle and plate, it is obvious that any number of shapes and configurations could be used, and any number of lead fingers could be employed, in coordination with the die that is to be wire bonded with the lead frame. For example, FIG. 2, main lead fingers 115 and 120 could connect at any location around the periphery of the respective paddle and plate 105 and 110. Specifically, the location of one of signal lead fingers 125 could be designated as the location for the connection of main lead finger 115. Likewise, body 102 is currently referenced with paddle 105 for supporting the die and overlaying plate 110, and body 112 is referenced with plate 110. However, if body 112 were to overlay body 102, then reference 110 would be considered the paddle for supporting the die, and reference 105 would be considered the plate.

Figure 3:
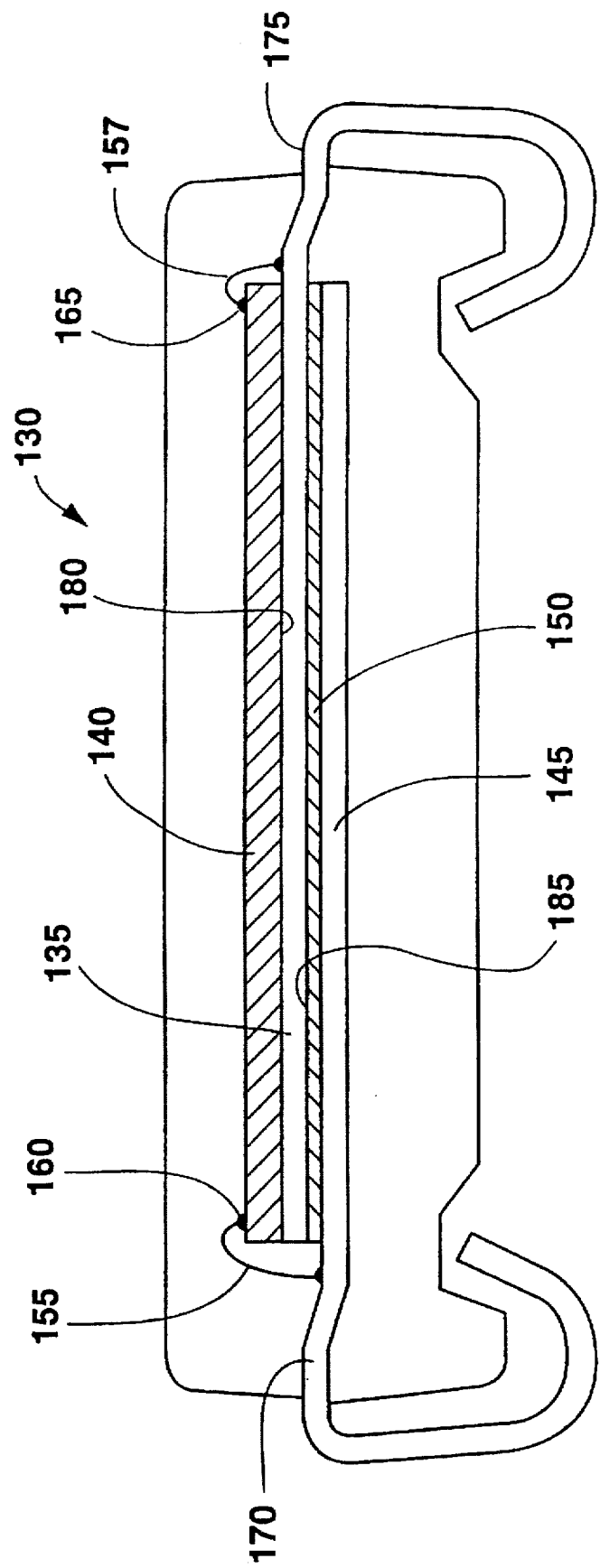
FIG. 3 is a cross-section view of a packaged IC device embodying the multi-layer lead frame of the present invention.

FIG. 3 is a cross-section view of a packaged IC device 130 embodying the multi-layer lead frame of the present invention. Die paddle 135 supports die 140 and overlays plate 145 with insulator 150 disposed therebetween.

One of paddle 135 and plate 145 provides one of power supply and ground connections for wire bonding with one of power and ground terminals of die 140. The other of the paddle and plate provides the other of power supply and ground connections for wire bonding with the respective power and ground terminals of the die.

Wire bonds 155 and 157 communicate between terminals 160 and 165 of die 140 and main lead fingers 170 and 175, respectively. Although not distinguishable from this view, one of terminals 160 and 165 may be a power terminal, and the other may be a ground terminal. Likewise, although not distinguishable from this view, one of lead fingers 170 and 175 may provide the power supply, and the other may provide the ground connection for die 140. Signal lead fingers which are disposed only proximate the paddle and plate for wire bonding are not visible from this view as they are disposed "behind" main lead fingers 170 and 175.

Die 140 is supportable on a first planar surface 180 of paddle 135, and a second planar surface 185, opposite the first planar surface of the paddle, overlays plate 145 with insulator 150 disposed therebetween. Insulator 150 adheres paddle 135 to plate 145 and protects them from electrically shorting with each other.

While a preferred embodiment of the invention has been disclosed, various modes of carrying out the principles disclosed herein are contemplated as being within the scope of the following claims. Therefore, it is understood that the scope of the invention is not to be limited except as otherwise set forth in the claims.

What is claimed is:

1. A multi-layer lead frame for a semiconductor die, comprising:
   a first conducting lead frame body having a die paddle for supporting the die and defining a perimeter, a first main lead finger depending from said die paddle, a first lead finger bar depending solely from said first main lead finger and supporting a first plurality of lead fingers extending from said first lead finger bar to proximate a first portion of said perimeter;
   a second conducting lead frame body having a plate, a second main lead finger depending from said plate, a second lead finger bar depending solely from said second main lead finger and supporting a second plurality of lead fingers extending from said second lead finger bar to proximate a second portion of said perimeter; and,
   an insulator disposed between and in contact with said die paddle and said plate.

2. The lead frame of claim 1, further including a semiconductor die attached to said die paddle and wire bonded to said first and second main lead fingers and said first and second plurality of lead fingers.

3. The lead frame of claim 2, wherein said die paddle and said first main lead finger provide a power supply connection for wire bonding with said semiconductor die and said plate and said second main lead finger provide a ground supply connection for wire bonding with said semiconductor die.

4. The lead frame of claim 3, wherein said first main lead finger, said first lead finger bar and said first plurality of lead fingers are formed as part of said die paddle.

5. The lead frame of claim 3, wherein said second main lead finger, said second lead finger bar, and said second plurality of lead fingers are formed as part of said plate.

6. The lead frame of claim 1, wherein said insulator is formed from a dielectric material.

7. The lead frame of claim 1, wherein said first main lead finger and said second main lead finger extend from said die paddle and said plate, respectively, on opposite sides of said perimeter.

8. The lead frame of claim 7, wherein said first main lead finger, said second main lead finger, said first lead finger bar, said second lead finger bar, said first plurality of lead fingers and said second plurality of lead fingers each lie in substantially different planes, said substantially different planes each being substantially perpendicular to a plane defined by a substantially planar surface of said die paddle.

9. The lead frame of claim 8, wherein said second conducting lead frame body is substantially identical to said first conducting lead frame body rotated approximately 180 degrees in said plane defined by said substantially planar surface.

10. The lead frame of claim 1, wherein said plate and said die paddle are substantially similar in circumferential size and shape to said semiconductor die.

11. A multi-layer lead frame for decoupling a power supply to a semiconductor die, comprising:
    a first lead frame segment including a first body defining a perimeter, a first main lead finger depending from said first body, a first lead finger bar depending solely from said first main lead finger and supporting a first plurality of lead fingers extending from said first lead finger bar to proximate a first portion of said perimeter;
    a second lead frame segment including a second lead finger bar supporting a second plurality of lead fingers extending from said second lead finger bar to proximate a second portion of said perimeter;
    a second body;
    a second main lead finger depending from said second body; and
    an insulator disposed between and in contact with said first body and said second body.

12. The lead frame of claim 11, further including a semiconductor die attached to said first body and wire bonded to said first and second plurality of lead fingers and said first and second main lead fingers.

13. The lead frame of claim 12, wherein said first body and said first main lead finger provide a power supply connection for wire bonding with said semiconductor die and said second body and said second main lead finger provide a ground supply connection for wire bonding with said semiconductor die.

14. The lead frame of claim 13, wherein said first main lead finger, said first lead finger bar and said first plurality of lead fingers are formed as part of said first body.

15. The lead frame of claim 12, wherein said first body and said second body are substantially similar in circumferential size and shape to said semiconductor die.

16. The lead frame of claim 11, wherein said insulator is formed from a dielectric material.

17. The lead frame of claim 11, wherein said first main lead finger and said second main lead finger extend from said first body and said second body, respectively, on opposite sides of said perimeter.

18. The lead frame of claim 17, wherein said first main lead finger, said second main lead finger, said first lead finger bar, said second lead finger bar, said first plurality of lead fingers and said second plurality of lead fingers lie in substantially different planes, said substantially different planes each being substantially perpendicular to a plane defined by a substantially planar surface of said first body.

19. The lead frame of claim 18, wherein said second body, said second main lead finger, said second main lead finger bar, and said second plurality of lead fingers are each substantially identical, rotated approximately 180 degrees in said plane defined by said substantially planar surface, to said first body, said first main lead finger, said first lead finger bar, and said first plurality of lead fingers, respectively.

* * * * *